United States Patent [19]

Amemiya et al.

[11] Patent Number: 5,329,126
[45] Date of Patent: Jul. 12, 1994

[54] APPARATUS AND PROCESS FOR VACUUM-HOLDING AN OBJECT

[75] Inventors: Mitsuaki Amemiya, Isehara; Shunichi Uzawa, Tokyo, both of Japan

[73] Assignee: Canon Kabuhiki Kaisha, Tokyo, Japan

[21] Appl. No.: 95,484

[22] Filed: Jul. 23, 1993

Related U.S. Application Data

[63] Continuation of Ser. No. 854,402, Mar. 19, 1992, abandoned.

[30] Foreign Application Priority Data

Mar. 22, 1991 [JP] Japan .................................. 3-081140

[51] Int. Cl.$^5$ ............................................. G01N 21/00
[52] U.S. Cl. ........................... 250/453.11; 250/440.11; 250/441.11; 250/548; 378/34
[58] Field of Search ...................... 378/34; 250/453.11, 250/548, 440.11, 441.11; 432/10

[56] References Cited

U.S. PATENT DOCUMENTS

| | | |
|---|---|---|
| 4,969,168 | 11/1990 | Sakamoto et al. |
| 5,063,582 | 11/1991 | Mori et al. |
| 5,093,579 | 3/1992 | Amemiya et al. |
| 5,131,022 | 7/1992 | Terashima et al. |
| 5,138,643 | 8/1992 | Sakamoto et al. |
| 5,142,156 | 8/1992 | Ozawa et al. |
| 5,172,189 | 12/1992 | Mitome ............................... 250/548 |
| 5,172,402 | 12/1992 | Mizusawa et al. .................... 378/34 |
| 5,191,218 | 3/1993 | Mori et al. ...................... 250/453.11 |

FOREIGN PATENT DOCUMENTS

| | | |
|---|---|---|
| 53-98782 | 8/1978 | Japan . |
| 55-123131 | 9/1980 | Japan . |
| 1-14703 | 3/1989 | Japan . |
| 1-52898 | 11/1989 | Japan . |
| 02100311 | 4/1990 | Japan . |

*Primary Examiner*—Henry C. Yuen
*Attorney, Agent, or Firm*—Fitzpatrick, Cella, Harper & Scinto

[57] ABSTRACT

Disclosed are an object holding process and and an apparatus therefor in which a process strain of the object can be accurately compensated for. When the exposure operation is started, the bottom surface of the object is held by a holding unit. If the object has a strain, the process strain is calculated. Here, if the process strain is larger than a tolerance, the temperature of the object is set to an object setting temperature in a position other than an exposure position in order to contract or expand the object by a predetermined amount for a magnification correction. The bottom surface of the object is then held by the holding unit again, and the exposure of the object is performed in the exposure position.

26 Claims, 3 Drawing Sheets

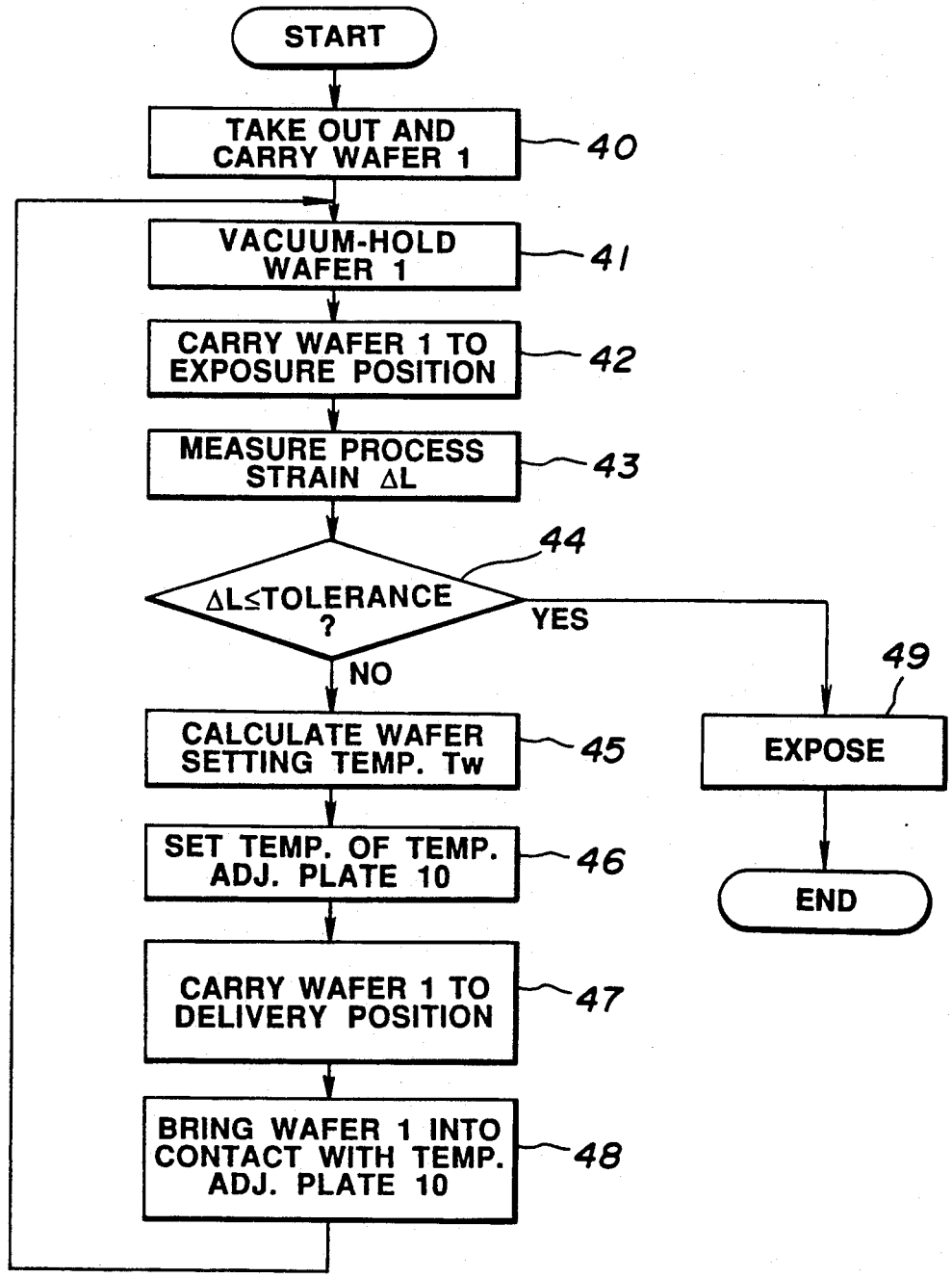

APPARATUS AND PROCESS FOR VACUUM-HOLDING AN OBJECT

This application is a continuation, of application Ser. No. 07/854,402 filed Mar. 19, 1992, now abandoned.

BACKGROUND OF THE INVENTION

1. Field of the Invention

The present invention relates to an apparatus and a process for holding an object such as a substrate and a wafer, and in particular, to an apparatus and a process for holding a substrate suitable to be used in a proximity exposure apparatus or aligner.

2. Related Background Art

In recent years, there has been a growing need to improve refined working techniques in semiconductor device or IC fabrication apparatuses as the capacity of semiconductor memories is enhanced. However, in order to improve the refined working techniques of the IC fabrication apparatuses, an enhancement of alignment accuracy between a wafer and a mask as well as a high resolution of a light source is required.

In order to achieve the high resolution of a light source, it is possible to use a synchrotron radiation light as a light source in place of a far ultra violet radiation and the like conventionally used in exposure apparatuses (see, for example, Japanese Laid-open (Kokai) No. 2-100311). On the other hand, in order to attain the enhancement of the alignment accuracy, it is necessary to compensate for process strains resulting from ion milling, etching and the like as well as to reduce a positional detection error by the improvement of accuracy in an alignment system for performing the alignment between a wafer and a mask.

In the light of the above facts, following systems or processes have been presented as a process for vacuum-holding a wafer in which the refined working techniques of the IC fabrication apparatus are improved.

(1) Process strains are compensated for by independently controlling temperatures of a wafer and a mask to expand or contract them. Thus, the process strains are compensated for by a magnification correction (see, for example, Japanese Laid-open No. 53-98782).

(2) Air is caused to flow between a wafer and a mask to generate an air curtain. Hence, the temperature of at least one of the wafer and the mask is controlled to expand or contract them, and a magnification correction is conducted. As a result, process strains are compensated for (see, for example, Japanese Laid-open No. 55-123131).

(3) After a wafer is vacuum-held by a wafer chuck, the vacuum-holding is once released. Temperatures of the wafer and the wafer chuck are then made equal to each other (see, for example, Japanese Publication (Kokoku) Nos. 1-14703 and 1-52898).

Following problems, however, occur in a case where each of the above-discussed wafer vacuum-holding processes is applied to an X-ray exposure apparatus using the above-mentioned synchrotron radiation light as a light source which is one of proximity type exposure apparatuses.

(1) In the process disclosed in the Japanese Laid-open No. 53-98782, when the wafer and the mask are arranged with a very narrow proximity gap (normally 10 to 100 $\mu$m) therebetween as in the above-discussed X-ray exposure apparatus, the temperature of the mask will also be changed if that of the wafer is varied. Therefore, it is difficult to independently change their temperatures.

(2) In the process disclosed in the Japanese Laid-open No. 55-123131, a proximity gap is extremely small. As a result, it is difficult to create the air curtain between the wafer and the mask. Further, there is a possibility that the mask will be bent.

(3) In the processes disclosed in the Japanese Publication Nos. 1-14703 and 1-52898, a thermal strain of the wafer can be removed. However, since the correction of a magnification cannot be performed, it is impossible to compensate for the process strains.

SUMMARY OF THE INVENTION

An object of the present invention is to provide an apparatus and a process for holding an object such as a substrate in which process strains can accurately be compensated for.

According to one aspect of an object holding process of the present invention, in the process for holding an object on an object holding unit the temperature of which is controlled, there are performed a first holding step of holding the object on the object holding unit in a first position such as an exposure position, a process strain measuring step of measuring a process strain of the object held on the object holding unit in the first position, a detecting step of detecting whether or not the measured process strain falls within a tolerance, a hold releasing step of releasing the hold of the object held on the object holding unit when the measured process strain falls without the tolerance, a temperature setting step of setting the temperature of the released object to a second predetermined temperature in a second position based on the measured process strain, and a second holding step of holding the object on the object holding unit. In the first holding step, the object holding unit is set to a first predetermined temperature such as an exposure atmosphere temperature, in the temperature setting step, the second position is different from the first position, and in the second holding step, the temperature of the object is set to the second predetermined temperature while the object holding unit is set to the first predetermined temperature.

According to another aspect of an object holding process of the present invention, in the process for holding an object on an object holding unit the temperature of which is controlled, there are performed a first holding step of holding the object on the object holding unit in a first position such as an exposure position, a process strain measuring step of measuring a process strain of the object held on the object holding unit in the first position, a detecting step of detecting whether or not the measured process strain falls within a tolerance, a temperature setting step of setting the temperature of the object to a second predetermined temperature in a second position based on the measured process strain by the object holding unit when the measured process strain falls without the tolerance, a hold releasing step of releasing the hold of the object held on the object holding unit, and a second holding step of holding the object on the object holding unit. In the first holding step, the object holding unit is set to a first predetermined temperature such as an exposure atmosphere temperature, in the temperature setting step, the second position is different from the first position and the object is held on the object holding unit, and in the second holding step, the temperature of the object is set to the second predetermined temperature while the object holding unit is set to the first predetermined temperature.

According to further another aspect of an object holding process of the present invention, in the process for holding an object on an object holding unit the temperature of which is controlled, there are performed a process strain estimating step of estimating a common process strain of a group of objects, a detecting step of detecting whether or not the estimated process strain falls within a tolerance, a temperature setting step of setting the temperature of the objects to a first predetermined temperature contained in an object cassette based on the estimated process strain, and a holding step of taking out the object from the object cassette and holding the object on the object holding unit. In the holding step, the temperature of the object is set to the first predetermined temperature and the object holding unit is set to a second predetermined temperature such as an exposure atmosphere temperature, and the process strain estimating step comprises, for example, a first holding step of holding one of the objects on the object holding unit in a first position such as an exposure position in which the object holding unit is set to the second predetermined temperature and the first position is different from a position of the object cassette, and a process strain measuring step of measuring a process strain of the one object held on the object holding unit in the first position.

According to one aspect of an object holding apparatus of the present invention, there are provided an object holding unit for holding an object, a process strain measuring unit for measuring a process strain of the object held on the object holding means in a first position such as an exposure position, a detecting unit for detecting whether or not the measured process strain falls within a tolerance, and a temperature setting unit for setting the temperature of the object released from the object holding unit to a second predetermined temperature in a second position other than the first position based on the measured process strain. The object holding unit is movable between the first position and another position and the temperature of the object holding is controllable, and the object holding unit is set to a first predetermined temperature such as an exposure atmosphere temperature in the first position.

According to another aspect of an object holding apparatus of the present invention, there are provided an object holding unit for holding the object which is movable between a first position and another position and the temperature of which is controllable, a process strain measuring unit for measuring a process strain of the object held on the object holding unit in the first position wherein the object holding means is set to a first predetermined temperature such as an exposure atmosphere temperature, and a detecting unit for detecting whether or not the measured process strain falls within a tolerance, and in this apparatus, the object holding unit sets the temperature of the object held by the object holding unit to a second predetermined temperature in the another position other than the first position based on the measured process strain when the measured process strain falls without the tolerance, and after the hold of the object by the object holding unit is once released and the object holding unit is returned to the first predetermined temperature, the object holding unit again holds the object and returns to the first position.

These advantages and others will be more readily understood in connection with the following detailed description, claims and drawings.

BRIEF DESCRIPTION OF THE DRAWINGS

FIG. 4 is a flow chart explaining the operation of the exposure apparatus shown in FIG. 1.

DETAILED DESCRIPTION OF THE PREFERRED EMBODIMENT

Figure 1:
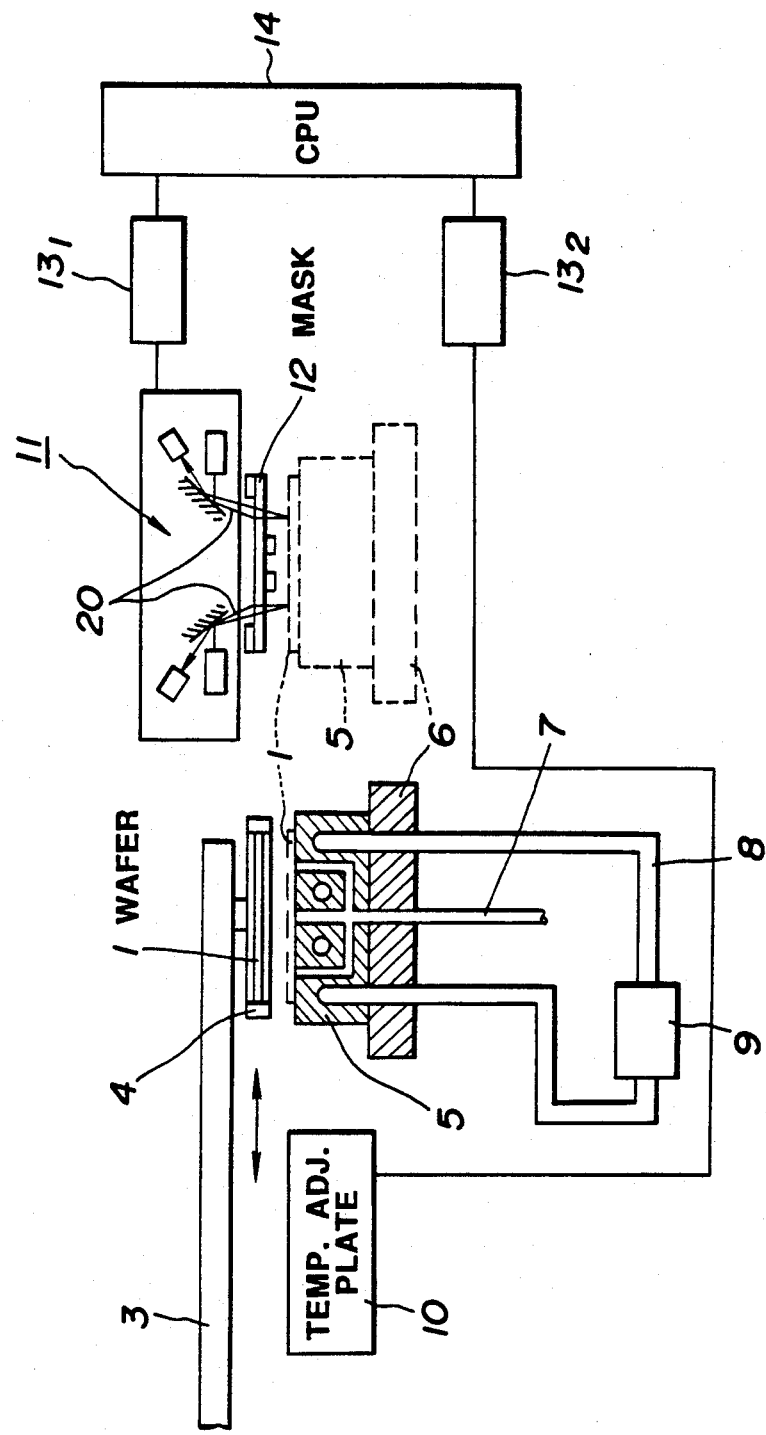
FIG. 1 is a schematic view showing the structure of an X-ray exposure apparatus to which the present invention is applied.

FIG. 1 shows an embodiment of an apparatus and a process for vacuum-holding a substrate of the present invention. The structure of an X-ray exposure apparatus illustrated.

The X-ray exposure apparatus is a type that is disclosed, for example, in the Japanese Laid-open No. 2-100311 which uses a synchrotron radiation light as a light source and in which a wafer 1 and a mask 12 are exposed as they stand upright.

Figure 2:
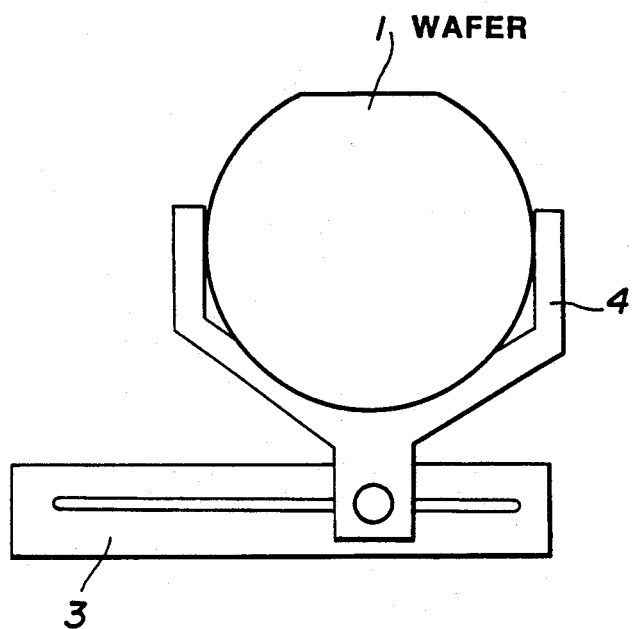
FIG. 2 is a schematic view showing the structure of a hand shown in FIG. 1.

In the X-ray exposure apparatus, there are arranged a wafer cassette (not shown) disposed at a left side of FIG. 1 and containing a plurality of wafers or substrates, a hand 4 for taking out the wafer 1 one by one from the wafer cassette and vacuum-holding the periphery of the wafer 1 to transfer the same as shown in FIG. 2, a wafer chuck 5 for receiving the wafer 1 from the hand 4 at a delivery position indicated by a solid line in FIG. 1 and vacuum-holding the bottom surface of the wafer 1, a guide 3 disposed between the wafer cassette and the wafer chuck 5 to which the hand 4 is slidably mounted in directions of arrows shown in FIG. 1, and an alignment unit 11 for conducting the alignment between the mask 12 and the wafer 1 vacuum-held by the wafer chuck 5 moved to an exposure position indicated by dotted lines in FIG. 1. The wafer chuck 5 is settled on a stage 6 and the wafer chuck 5 is a substrate vacuum-holding unit the temperature of which is controlled. The above structure is the same as that of a conventional X-ray exposure apparatus.

In the above structure, an exhaust pipe 7 is provided in the wafer chuck 5 to connect a chuck surface of the wafer chuck 5 where the wafer 1 is vacuum-held and a vacuum source (not shown) to each other. The exhaust pipe 7 is branched into a plurality of portions in the wafer chuck 5 and the branched portions are opened at the chuck surface. Further, there is arranged a water conduit 8 for circulating temperature-adjusted water supplied from a temperature-adjusted water circulating unit 9 to maintain the temperature of the wafer chuck 5 at a constant value. In the alignment unit 11, laser beams 20 are applied to alignment marks formed on the wafer 1 and the mask 12, respectively, and the positional deviation between them is detected using the reflected laser beams (see, for example, Japanese Laid-open No. 2-100311).

This X-ray exposure apparatus differs from the conventional X-ray exposure apparatus in that there are arranged a temperature adjusting plate 10 disposed near the wafer delivery position for adjusting the temperature of the wafer 1 and a micro-computer (CPU) 14 to which the alignment unit 11 and the temperature adjusting plate 10 are electrically connected through first and second interfaces 13₁ and 13₂, respectively.

Figure 3:
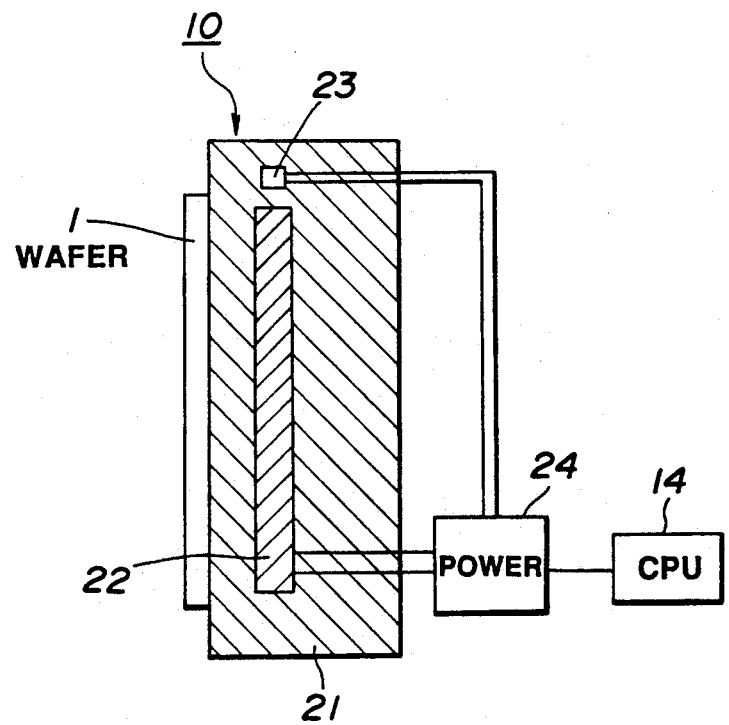
FIG. 3 is a schematic view showing the structure of a temperature adjusting plate shown in FIG. 1.

As illustrated in FIG. 3, the temperature adjusting plate 10 consists of a contact base 21 with which the bottom surface of the wafer 1 is to be brought into contact at the time of the temperature adjustment, a heating-cooling element 22 embedded in the contact base 21 parallel to a contact surface thereof (a surface where the wafer 1 is to be brought into contact) and made of a Peltier element, a thermal resistance body or the like, a temperature sensor 23 embedded in the contact base 21 near its contact surface and composed of a thermistor or the like, and a power supply 24 for supplying a control current to the heating-cooling element 22. The power 24 is electrically connected to the heating-cooling element 22, the temperature sensor 23 and the CPU 14, and supplies the control current based on a difference $T_W-T$ between a wafer setting temperature $T_W$ fed from the CPU 14 and a temperature $T$ detected by the temperature sensor 23.

The operation of this embodiment will be explained referring to a flow chart of FIG. 4.

(1) First vacuum-holding step

When an exposure operation is started, the hand 4 takes out the wafer 1 from the wafer cassette and carries the wafer 1 to the delivery position (step 40). In the delivery position, the wafer 1 is received by the wafer chuck 5, and its bottom surface is vacuum-held (step 41). At this time, since the temperature of the wafer chuck 5 is kept constant by the temperature-adjusted water, the temperature of the wafer 1 is also maintained at this temperature.

(2) Process strain measuring step

The stage 6 is moved to the exposure position by a driving unit (not shown), and the wafer 1 vacuum-held by the wafer chuck 5 settled on the stage 6 is moved to the exposure position (step 42). The alignment between the wafer 1 and the mask 12 is then performed by the alignment unit 11 using the alignment marks formed on the wafer 1 and the mask 12, respectively. Here, when the wafer 1 has strains, the interval between the alignments formed on the wafer 1 will not be coincident with that between the alignment marks formed on mask 12. Thus, the alignment cannot be achieved. Therefore, in this case, the interval $L_1$ between the alignment marks formed on the wafer 1 is measured by the alignment unit 11 in order to measure the process strain $\Delta L$. The process strain $\Delta L = (L_1 - L_0)/L_0$ is then calculated by the CPU 14 using the measured interval $L_1$ and a regular interval $L_0$ (step 43).

(3) Detecting step

If the process strain $\Delta L$ measured in the process strain measuring step falls within a tolerance or not is detected (step 44), and the exposure of the wafer 1 is started if the process strain $\Delta L$ is less than the tolerance (step 49). On the other hand, if the process strain $\Delta L$ is larger than the tolerance, following vacuum-hold releasing and temperature setting steps will be conducted.

(4) Vacuum-hold releasing step and temperature setting step

In the CPU 14, the wafer setting temperature $T_W$ is calculated in the following manner (step 45). The wafer setting temperature $T_w$ is obtained by:

$$T_W = T_R + \Delta L/\alpha \qquad (1)$$

where $\alpha$ is a coefficient of linear expansion of the wafer 1 and $T_R$ is an exposure atmosphere temperature. If, for example, the process strain is equal to $\Delta L = 10^{-6}$, the coefficient of linear expansion $\alpha = 2.4 \times 10^{-6}$ (1/°C.) and the exposure atmosphere temperature $T_R = 23.0$ (°C.), the wafer setting temperature $T_W = 23.42$ (°C.) is obtained from the equation (1). After the wafer setting temperature $T_W$ has been obtained, the control current according to the difference $T_W - T$ between the wafer setting temperature $T_W$ and the temperature $T$ detected by the temperature sensor 23 is output to the heating-cooling element 22 by the power 24 shown in FIG. 3, and the temperature of the temperature adjusting plate 10 is thus set (step 46). Further, the stage 6 is moved to the delivery position by the driving unit, and the wafer 1 vacuum-held by the wafer chuck 5 is thus returned to the delivery position (step 47). Thereafter, the vacuum-holding of the wafer 1 by the wafer chuck 5 is released (vacuum-hold releasing step), and the wafer 1 is then handed to the hand 4. The wafer 1 is carried onto the contact surface of the temperature adjusting plate 10 by the hand 4, and the bottom surface of the wafer 1 is brought into contact with the contact surface of the plate 10 (step 48). When the bottom surface of the wafer 1 is brought into contact with the contact surface, the temperature of the wafer 1 is set to the wafer setting temperature $T_W (= 23.42°$ C.). As a result, the wafer 1 is expanded by a predetermined amount, and the magnification correction is completed (temperature setting step).

(2) Second vacuum-holding step

After the temperature of the wafer 1 is set to the wafer setting temperature $T_W$, the wafer 1 is again moved to the delivery position by the hand 4 and then handed to the wafer chuck 5. The bottom surface of the wafer 1 is thus vacuum-held by the wafer chuck 5 (step 41). At this time, since the temperature of the wafer chuck 5 is maintained at the exposure atmosphere temperature $T_R (=23.0°$ C.) by the temperature adjusted water, the wafer 1 would not contract even if this is liable to contract for the wafer 1 is vacuum-held by the wafer chuck 5 with a stronger force than this liability. Afterwards, the steps 42 to 44 are again performed. The exposure is started if it is confirmed that the process strain $\Delta L$ falls within the tolerance range in the step 44 (step 49).

In the foregoing, the heating-cooling element 22 consisting of a Peltier element, a thermal resistance body or the like is used in order to conduct the temperature setting of the temperature adjusting plate 10. However, in place of the heating-cooling element 22, the temperature-adjusted water may be circulated in the contact base 21 (see FIG. 3) similar to the wafer chuck 5.

Further, the wafer chuck 5 may also be caused to act as the temperature adjusting plate 10. In this case, however, the wafer chuck 5 should be made of a material whose coefficient of linear expansion $\alpha_C$ is different from the coefficient of linear expansion $\alpha$ of the wafer 1, and the wafer setting temperature $T_W$ in the temperature setting step is obtained by:

$$T_W = T_R + \Delta L/(\alpha - \alpha_C) \qquad (2).$$

The temperature of the wafer 1 is thus brought to the wafer setting temperature $T_W$.

Next, the vacuum-holding of the wafer 1 by the wafer chuck 5 is once released in the vacuum-hold releasing step, and after the temperature of the wafer chuck 5 is again set to the exposure atmosphere temperature $T_R$, the wafer 1 is again vacuum-held by the wafer chuck 5 in the second vacuum-holding step. The wafer 1 vacuum-held by the wafer chuck 5 is then returned to the exposure position. The remaining is the same as the above-discussed embodiment with the exception that the temperature-adjusted water circulating unit 9 is electrically connected to the CPU 14 through the second interface $13_2$.

Although not shown in FIG. 1, an orientation flat detecting unit for adjusting the orientation of the wafer 1 may be arranged between the wafer cassette and the wafer chuck 5 as is often the case with this kind of an X-ray exposure apparatus (see, for example, Japanese Laid-open No. 2-100311). In such a case, it is also possible to cause the orientation flat detecting unit to act as the temperature adjusting plate 10. Moreover, it is also possible to cause the hand 4 to act as the temperature adjusting plate 10. In these cases, the orientation flat detecting unit and the hand 4 are electrically connected to the CPU 14 through the second interface $13_2$, respectively.

The compensation operation of the process strain may be performed for each wafer, but in a case where there is little divergence of the process strains in the same lot (all wafers 1 contained in the wafer cassette), the operation may be performed as follows: The compensation operation of the process strain is conducted only for a wafer 1 initially taken out of the wafer cassette. For the second wafer onward in this wafer cassette, the temperature setting (see the step 46) is performed in the wafer cassette, and the wafer 1 is then taken out by the hand 4 one by one. Here, the temperature of the wafer chuck 5 is maintained at the exposure atmosphere temperature $T_R$. Naturally, the wafer cassette is electrically connected to the CPU 14.

If the wafer 1 is strained anisotropically, the temperature distribution of the temperature adjusting plate 10 may be set in accordance with such strain of the wafer 1.

In the above embodiment, the description is made as to the X-ray exposure apparatus using a synchrotron radiation light as a light source, but the present invention may also be applied to other exposure apparatuses such as a proximity exposure apparatus using an ultra violet light as a light source. Further, an object the process strain of which is to be compensated for is not limited to the wafer, but the object may be other objects such as a substrate of a liquid crystal display or the like on which thin film transistors and the like are to be formed.

The following advantages can be obtained by the structure of the present invention.

Since the above-discussed first vacuum-holding step, process strain measuring step, detecting step, vacuum-hold releasing step, temperature setting step and second vacuum-holding step are performed in the process and the apparatus for vacuum-holding a substrate of the present invention, the temperature of a mask would not be adversely affected even when the substrate and the mask are positioned with a very narrow proximity gap therebetween. Therefore, the temperature of the substrate can be set based on process strains of the substrate, and hence the magnification correction can be accurately achieved by expansion or contraction of the substrate. As a result, the process strains can be accurately compensated for.

While the present invention has been described with respect to what is presently considered to be the preferred embodiment, it is understood that the invention is not limited to the disclosed embodiment. The present invention is intended to cover various modifications and equivalent arrangements included within the spirit and scope of the appended claims.

What is claimed is:

1. A process for holding an object on an object holding unit the temperature of which is controlled, said process comprising:

a first holding step of holding the object on the object holding unit in a first position, said object holding unit being set to a first predetermined temperature;

a process strain measuring step of measuring a process strain of the object held on the object holding unit in the first position;

a detecting step of detecting whether or not the measured process strain falls within a tolerance;

a hold releasing step of releasing the hold of the object held on the object holding unit when the measured process strain falls out of the tolerance;

a temperature setting step of setting the temperature of the released object to a second predetermined temperature in a second position based on the measured process strain, the second position being different from the first position; and a second holding step of holding the object on the object holding unit, the temperature of the object being set to the second predetermined temperature.

2. A process according to claim 1, wherein the first position is an exposure position in which the object is located in the vicinity of a mask.

3. A process according to claim 1, wherein the first predetermined temperature is an exposure atmosphere temperature.

4. A process according to claim 1, wherein the object is also set to the first predetermined temperature in said first holding step.

5. A process according to claim 1, wherein the strain process $\Delta L$ is obtained by measuring an interval $L_1$ between alignment marks formed on the object and calculating $(L_1 - L_0)/L_0$ where $L_0$ is a regular interval.

6. A process according to claim 5, wherein the second predetermined temperature is obtained by $T_R + \Delta L/\alpha$ where $T_R$ is an exposure atmosphere temperature and $\alpha$ is a coefficient of linear expansion of the object.

7. A process according to claim 1, wherein the object is set to the second predetermined temperature by a temperature adjusting unit different from the object holding unit after the object is moved from the object holding unit to the temperature adjusting unit.

8. A process according to claim 7, wherein the temperature adjusting unit comprises a temperature adjusting plate.

9. A process according to claim 7, wherein the temperature adjusting unit comprises a hand for transferring the object from an object cassette to a delivery position in which the object is handed between the hand and the object holding unit.

10. A process according to claim 7, wherein the temperature adjusting unit comprises an orientation flat unit for adjusting the orientation of the object which is disposed between an object cassette and the object holding unit.

11. A process according to claim 1, wherein the object holding unit is set to the second predetermined temperature in said second holding step.

12. A process according to claim 1, wherein the object is a wafer to which a pattern formed on a mask is to be transferred by a proximity method.

13. A process according to claim 1, wherein the object is a substrate of a liquid crystal display.

14. A process for holding an object on an object holding unit the temperature of which is controlled, said process comprising:
 a first holding step of holding the object on the object holding unit in a first position, said object holding unit being set to a first predetermined temperature;
 a process strain measuring step of measuring a process strain of the object held on the object holding unit in the first position;
 a detecting step of detecting whether or not the measured process strain falls within a tolerance;
 a temperature setting step of setting the temperature of the object to a second predetermined temperature in a second position based on the measured process strain by the object holding unit when the measured process strain falls out of the tolerance, the second position being different from the first position and the object being held on the object holding unit;
 a hold releasing step of releasing the hold of the object held on the object holding unit; and
 a second holding step of holding the object on the object holding unit, the temperature of the object being set to the second predetermined temperature while the object holding unit is set to the first predetermined temperature.

15. A process according to claim 14, wherein the strain process $\Delta L$ is obtained by measuring an interval $L_1$ between alignment marks formed on the object and calculating $(L_1 - L_0)/L_0$ where $L_0$ is a regular interval.

16. A process according to claim 15, wherein the second predetermined temperature is obtained by $T_R + \Delta L/(\alpha - \alpha_C)$ where $T_R$ is an exposure atmosphere temperature, $\alpha$ is a coefficient of linear expansion of the object and $\alpha_C$ is a coefficient of linear expansion of the object holding unit.

17. A process according to claim 14, wherein the first position is an exposure position in which the object is located in the vicinity of a mask.

18. A process according to claim 14, wherein the first predetermined temperature is an exposure atmosphere temperature.

19. A process according to claim 14, wherein the object is also set to the first predetermined temperature in said first holding step.

20. A process for holding an object on an object holding unit the temperature of which is controlled, said process comprising:
 a process strain estimating step of estimating a common process strain of a group of objects;
 a detecting step of detecting whether or not the estimated process strain falls within a tolerance;
 a temperature setting step of setting the temperature of the objects to a first predetermined temperature contained in an object cassette based on the estimated process strain; and
 a holding step of taking out the object from the object cassette and holding the object on the object holding unit, the temperature of the object being set to the first predetermined temperature and the object holding unit being set to a second predetermined temperature.

21. A process according to claim 20, wherein said process strain estimating step comprises a first holding step of holding one of the objects on the object holding unit in a first position, said object holding unit being set to the second predetermined temperature and the first position being different from a position of the object cassette, and a process strain measuring step of measuring a process strain of the one object held on the object holding unit in the first position.

22. A process according to claim 20, wherein the second predetermined temperature is an exposure atmosphere temperature.

23. A process according to claim 21, wherein the first position is an exposure position in which the object is located in the vicinity of a mask.

24. A process according to claim 21, wherein the one object is also set to the second predetermined temperature in said first holding step.

25. A process according to claim 21, wherein the process strain $\Delta L$ is obtained by measuring an interval $L_1$ between alignment marks formed on the one object and calculating $(L_1 - L_0)/L_0$ where $L_0$ is a regular interval.

26. A process according to claim 25, wherein the first predetermined temperature is obtained by $T_R + \Delta L/\alpha$ where $T_R$ is an exposure atmosphere temperature and $\alpha$ is a coefficient of linear expansion of the one object.

* * * * *

UNITED STATES PATENT AND TRADEMARK OFFICE
CERTIFICATE OF CORRECTION

PATENT NO. : 5,329,126
DATED : July 12, 1994
INVENTOR(S) : MITSUAKI AMEMIYA, et al.

It is certified that error appears in the above-indentified patent and that said Letters Patent is hereby corrected as shown below:

ON COVER PAGE:

At [56] Under Heading "FOREIGN PATENT DOCUMENTS":

"02100311 4/1990 Japan" should read --2-100311 4/1990 Japan--.

At [73] Assignee

"Canon Kabuhiki Kaisha" should read --Canon Kabushiki Kaisha--.

Signed and Sealed this

Twenty-ninth Day of August, 1995

Attest:

BRUCE LEHMAN

Attesting Officer     Commissioner of Patents and Trademarks